United States Patent
Peissig et al.

(10) Patent No.: US 8,190,427 B2
(45) Date of Patent: May 29, 2012

(54) COMPANDER WHICH USES ADAPTIVE PRE-EMPHASIS FILTERING ON THE BASIS OF LINEAR PREDICTION

(75) Inventors: Jürgen Peissig, Hannover (DE); Udo Zoelzer, Neu Wulmstorf (DE); Florian Keiler, Hannover (DE); Martin Holters, Hamburg (DE)

(73) Assignee: Sennheiser electronic GmbH & Co. KG, Wedemark (DE)

( * ) Notice: Subject to any disclaimer, the term of this patent is extended or adjusted under 35 U.S.C. 154(b) by 1006 days.

(21) Appl. No.: 11/887,861

(22) PCT Filed: Apr. 5, 2006

(86) PCT No.: PCT/EP2006/003076
§ 371 (c)(1),
(2), (4) Date: Apr. 4, 2008

(87) PCT Pub. No.: WO2006/105940
PCT Pub. Date: Oct. 12, 2006

(65) Prior Publication Data
US 2010/0204995 A1    Aug. 12, 2010

(30) Foreign Application Priority Data
Apr. 5, 2005   (DE) .......... 10 2005 015 647

(51) Int. Cl.
*G10L 19/00* (2006.01)
*G10L 19/14* (2006.01)
(52) U.S. Cl. ......... 704/217; 704/219; 704/225; 704/500
(58) Field of Classification Search .................. 704/217, 704/219, 225
See application file for complete search history.

(56) References Cited

U.S. PATENT DOCUMENTS

| | | | | |
|---|---|---|---|---|
| 4,507,791 A * | 3/1985 | Gundry | ......................... | 375/244 |
| 4,683,449 A * | 7/1987 | Kato | ............................... | 333/14 |
| 4,700,361 A * | 10/1987 | Todd et al. | .................... | 375/244 |
| 5,295,224 A * | 3/1994 | Makamura et al. | .......... | 704/223 |
| 5,737,434 A * | 4/1998 | Orban | ........................... | 381/106 |
| 6,714,093 B2 * | 3/2004 | Oppelt et al. | ................... | 333/14 |
| 6,895,375 B2 * | 5/2005 | Malah et al. | .................. | 704/219 |
| 7,225,135 B2 * | 5/2007 | Thomas | ....................... | 704/500 |
| 7,558,391 B2 * | 7/2009 | Bizjak | .......................... | 381/106 |

OTHER PUBLICATIONS

*DAFX-04 Conference on Digital Audio Effects*, Naples, Italy, 2004, pp. 285-290, "Digital emulation of analog companding algorithms for FM radio transmission" Juergen Peissig, et al.

*IEEE International Conference on Acoustics, Speech, and Signal Processing*, vol. 1, Apr. 1997, pp. 335-338, "Spectral Amplitude Warping (SAW) for Noise Spectrum Shaping in Audio Coding" Roch Lefebvre, et al.

*Proceedings of the IEEE*, vol. 63, Apr. 1975, pp. 561-580, "Linear prediction: A tutorial review", John Makhoul.

*IEEE International Conference on Acoustics, Speech, and Signal Processing*, May 1997, pp. 683-686, "A continuously-adaptive filter implemented as a lattice structure", Lloyd J. Griffiths.

* cited by examiner

*Primary Examiner* — Talivaldis Ivars Smits
*Assistant Examiner* — Jesse Pullias
(74) *Attorney, Agent, or Firm* — Frommer Lawrence & Haug LLP

(57) ABSTRACT

A compressor device for a compander system has a level detecting/control device and a pre-emphasis device for carrying out an adaptive pre-emphasis filtering. The invention is also directed to an expander device for a compander system with a level detecting/control device and a de-emphasis device for carrying out an adaptive de-emphasis filtering.

11 Claims, 6 Drawing Sheets

COMPANDER WHICH USES ADAPTIVE PRE-EMPHASIS FILTERING ON THE BASIS OF LINEAR PREDICTION

CROSS-REFERENCE TO RELATED APPLICATIONS

This is a national phase application of International Application No. PCT/EP2006/003076, filed Apr. 5, 2006 which claims priority of German Application No. 10 2005 015 647.9, filed Apr. 5, 2005, the complete disclosures of which are hereby incorporated by reference.

BACKGROUND OF THE INVENTION a) Field of the Invention

The present invention is directed to a compressor device, an expander device, and a compander system and to a corresponding transmission method.

b) Description of the Related Art

Compander systems are known, for example, from the sphere of cassette recorders or analog FM radio transmission systems for suppressing noise and increasing the dynamic range. A digital implementation of a system of this kind was described by Peissig et al. in "Digital emulation of analog companding algorithms for FM radio transmission", *DAFX-04 Conference on Digital Audio Effects*, pages 285-290, Naples, Italy, 2004. For this purpose, analog circuits were replaced by a digital signal processor.

A cassette recorder or an analog FM radio transmission typically has an audio dynamic range of only 50-70 dB. As a result of this reduced dynamic range, audible noise cannot be prevented. Audio compressors are used during recording or during transmission to suppress perception of this noise. The compressor reduces the dynamic range of the input signal so that all signal amplitudes lie above the noise threshold. During playback or FM reception, an expander restores the original dynamic range of the signal using attenuation depending on the signal amplitude. Accordingly, the dynamic range is expanded and the noise level is reduced simultaneously. A system of this kind is known as a compander (compression and expansion) and performs a time-variable processing for audibly changing the processed signal.

FIG. 6 shows a block diagram of a conventional compander system. The system has a pre-emphasis unit PRE, a multiplier unit M1, a level detecting and control unit LDC, and a divider unit D1. The compressed signal is transmitted over a channel Ch and the reception side or expander side has, likewise, a level detecting and control unit LDC and also a de-emphasis unit De. The level detecting and control unit LDC serves to derive a gain factor from the signal level so that the dynamic range of the input signal in the compressor is reduced by amplifying weak signals, while strong signals remain unchanged. In the expander, the process is carried out in reverse on the reception side in that the same gain factors are derived and the signal is divided by these gain factors by the divider unit D1. The channel noise is reduced for most of the weak signals, which results in an improved audio quality. In addition, pre-emphasis filtering can be implemented on the transmission side, which slightly amplifies high frequencies, while the inverse operation of de-emphasis filtering is implemented on the reception side so that the channel noise is attenuated at higher frequencies.

Further, a compression/expansion can be carried out in different sub-bands. This has the advantage that compression parameters such as the time constants for the level detection of the different sub-bands, for example, can be selected individually so that a better balance can be found between noise reduction and the emergence of compression artifacts. Further, not only is the remaining noise at the expander output reduced, but the spectrum of noise is shaped substantially corresponding to the signal so that much of the noise falls below an audibility threshold.

"Spectral amplitude warping (SAW) for noise spectrum shaping in audio coding", *IEEE International Conference on Acoustics, Speech, and Signal Processing*, Volume 1, pages 335-338, April 1997, shows a block-by-block transformation of the input signal into the frequency domain, application of a non-linear mapping for every frequency bin, and a back-transformation into the time domain using overlap-and-add. Both the transmitter and the receiver operate in this way and differ only in the non-linear function that is used. In the transmitter, the kth frequency X(k) is mapped by $$f_k(X(k)) = \frac{X(k)}{|X(k)|} |X(k)|^{\alpha(k)}, \quad 0 < \alpha(k) \le 1,$$

whereas in the receiver the inverse equation is used, i.e., the exponent is replaced by $1/\alpha(k)$.

Spectral amplitude warping (SAW) can improve the perceived quality of audio coding systems that do not shape noise in any adequate way by implementing pre-processing steps or post-processing steps in an existing coder. It may be assumed that this method is also suitable for a noisy analog communications link. However, the main disadvantage of this method is the latency at both ends due to the block-based processing.

OBJECT AND SUMMARY OF THE INVENTION

Therefore, it is the primary object of the present invention to provide a compressor device, an expander device and a compander system which changes noise substantially without latency.

This object is met by a compressor device in accordance with the invention for a compander system having a level detecting/control device and a pre-emphasis device for carrying out an adaptive pre-emphasis filtering with a filter adaption unit which is designed to carry out an adaption of the pre-emphasis device based on a linear prediction.

The object is also achieved in accordance with the invention by an expander device for a compander system with a level detecting/control device and a de-emphasis device for carrying out an adaptive de-emphasis filtering with a filter adaption unit which is designed to carry out an adaption of the de-emphasis device based on a linear prediction.

The object is further achieved by a compander system with a compressor device as described above and/or a compander device as also described above.

Accordingly, a compressor device is provided for a compander system. The compressor device has a level detecting/controlling device and a pre-emphasis device for carrying out adaptive pre-emphasis filtering.

The invention is also directed to an expander device for a compander system with a level detecting/controlling device and a de-emphasis device for carrying out adaptive de-emphasis filtering.

The invention is based on the idea of providing adaptive filters for pre-emphasis and de-emphasis. In a compressor, a dynamic compression is carried out in connection with a linear prediction of a pre-emphasis unit. In an expander, a dynamic expansion is carried out based on a linear prediction. The pre-emphasis unit and the de-emphasis unit can each have a feedback.

The embodiment examples are described more fully in the following with reference to the drawings.

DESCRIPTION OF THE PREFERRED EMBODIMENTS

Figure 1:
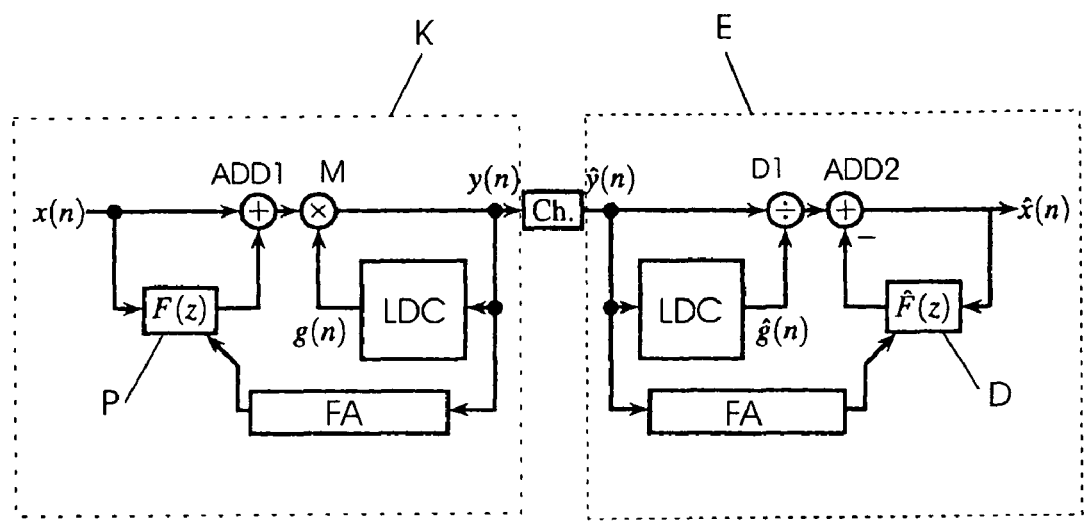
FIG. 1 shows a block diagram of a compander system according to a first embodiment example.

FIG. 1 shows a block diagram of a compander system according to a first embodiment example. The compander system substantially comprises a compressor K, a transmission channel Ch, and an expander E. The compressor K has a level detecting/control device LDC, a filter P for pre-emphasis filtering, and a filter adaption unit FA. The expander E likewise has a level detecting/control unit LDC, a filter D for de-emphasis filtering, and a filter adaption unit FA.

The input signal, preferably an audio signal x(n), is fed to the adding unit ADD1 on the one hand and to the filter P on the other hand. In the filter P, a pre-emphasis filtering is carried out based on the output of the filter adaption unit FA. The output of the filter P is added to the input signal x(n) in the adding unit ADD1. The result of this addition is fed to a multiplying unit M, where the result of the addition is multiplied by a signal g(n). The multiplication results in the output signal y(n). This output signal y(n) is fed to the filter adaption unit FA and to the level detecting/control device LDC. The output of the level detecting/control device LDC yields signal g(n).

The output signal y(n) is transmitted over a channel Ch. This channel can be a wireless transmission link or radio link. The expander receives a signal ŷ(n) which is the output signal y(n) transmitted over channel Ch. This signal is fed to a divider D1, a filter adaption unit FA and a level detecting/control device LDC. The output of the level detecting/control device LDC, i.e., the signal an), is likewise fed to the divider D1, and the received signal ŷ(n) is accordingly divided by signal an). The result of this division is fed to a second adding unit ADD2, where an output of a filter G is subtracted from the result of the division. This addition gives output signal x̂(n). This signal is also the input signal of the filter D in which de-emphasis filtering is carried out based on the output signal of the filter adaption unit FA.

Filters P, D are preferably finite impulse response (FIR) filters or filters with unlimited impulse response behavior because their adaption is easier and less computationally intensive. The adaption is preferably carried out regularly or at periodic intervals. Since no side information is transmitted and, therefore, any block synchronization is impossible, the adaption is preferably carried out after every sample to prevent distortion due to displaced blocks in the compressor and expander. The FIR filters preferably have no direct path in order to avoid delay-free loops in the expander.

Figure 2:
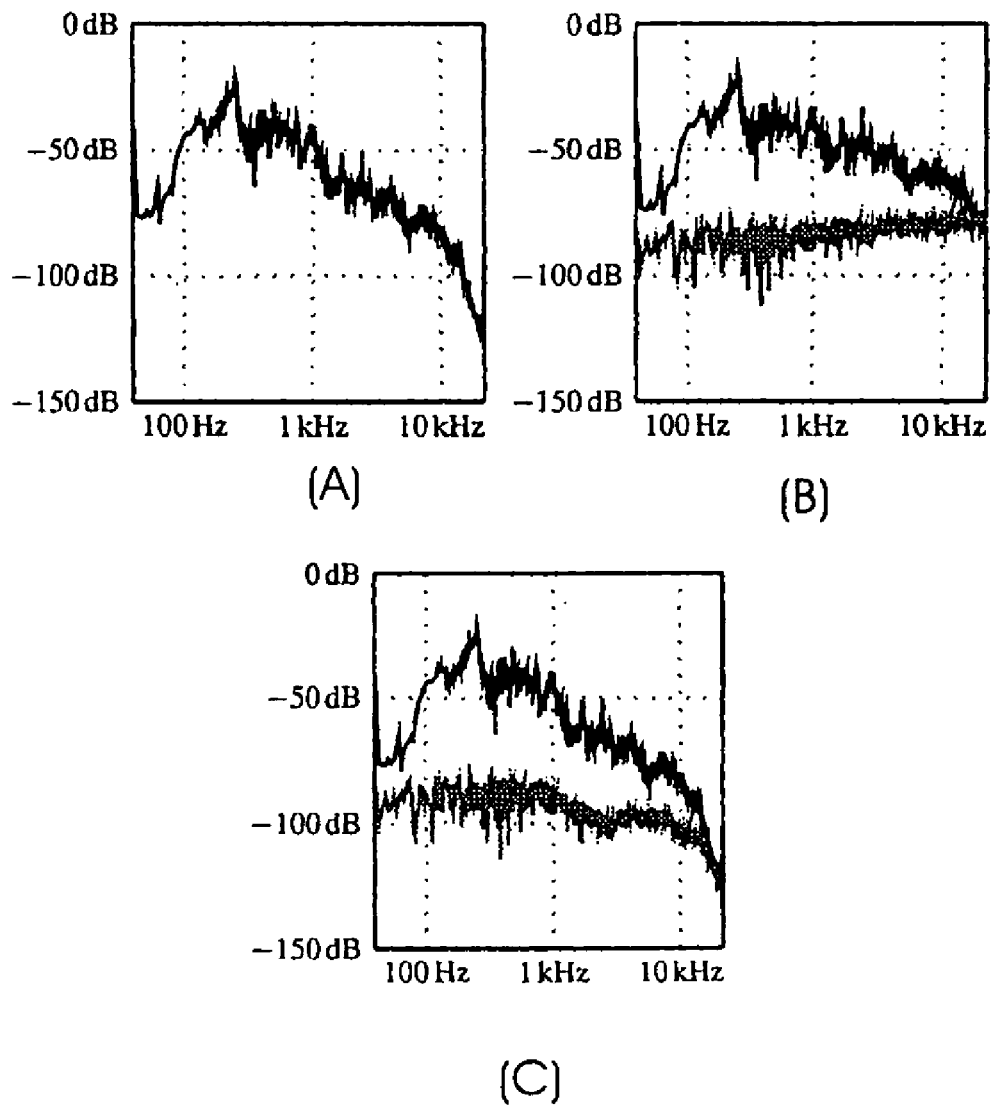
FIG. 2 shows spectra of a compander system according to the first embodiment example.

FIG. 2 shows three different spectra for the filtering according to the first embodiment example. FIG. 2A shows the original input signal x(n). FIG. 2B shows the compressed signal y(n) and the channel noise. FIG. 2C shows the reconstructed signal x̂(n) and the shaped noise at the expander output.

The aim of the filter adaption is to whiten the power spectral density $S_{YY}(e^{j\Omega})$ (using a normalized frequency $\Omega=2\pi f/f_s$) of the transmitted signal compared to the original signal $S_{XX}(e^{j\Omega})$:

$$S_{YY}(e^{j\Omega}) \approx S_{XX}^{\alpha}(e^{j\Omega}), 0<\alpha \leq 1. \tag{1}$$

The FIR filters F(z)p should have no direct path. The resulting pre-emphasis filter H(z)=1+F(z) at the adding unit ADD1 should have a minimum phase to provide a stable inverse function that can be used by the expander. The frequency response of a minimum-phase filter of this kind with a direct path coefficient $h_0=1$ satisfies the following equation according to Makhoul, "Linear prediction: A tutorial review", *Proceedings of the IEEE*, Volume 63, pages 561-580, April 1975:

$$\int_{-\pi}^{\pi} \log|H(e^{j\Omega})|^2 d\Omega = 0.$$

Accordingly, the filtering changes only the shape of the spectrum and leaves the average of the logarithmic spectrum unchanged. Consequently, a broadband compressor can be used together with the filter.

Therefore, a filter H(z), where $h_0=1$, must be found which has a minimum phase and a desired spectrum.

$$g^2|H(e^{j\Omega})|^2 = \frac{S_{YY}(e^{j\Omega})}{S_{XX}(e^{j\Omega})} \approx S_{YY}^{1-\frac{1}{\alpha}}(e^{j\Omega}). \tag{2}$$

Equation (2) was derived from Equation (1), where g is the gain factor which will be approximated by the broadband compressor. When α=0.5, the equation simplifies to:

$$g^2|H(e^{j\Omega})|^2 \approx S_{YY}^{-1}(e^{j\Omega}) \tag{3}$$

In the following, it will be described more fully how the adaption is realized using a linear prediction. The prediction error filter resulting from a linear prediction of y(n) has all of the desired properties, including the optimized approximation of Equation (3).

The Yule-Walker equations, for example, present a solution to the prediction problem:

$$R_{YY}h = -r_{YY}, \tag{4}$$

$$R_{YY} = \begin{bmatrix} r_{YY}(0) & r_{YY}(1) & \cdots & r_{YY}(M-1) \\ r_{YY}(1) & r_{YY}(0) & \cdots & r_{YY}(M-2) \\ \vdots & \vdots & \ddots & \vdots \\ r_{YY}(M-1) & r_{YY}(M-2) & \cdots & r_{YY}(0) \end{bmatrix},$$

where $R_{YY}$ is the autocorrelation matrix, $$r_{YY}=[r_{YY}(1)r_{YY}(2)\ldots r_{YY}(M)]^T$$

is the autocorrelation vector, and $$h=[h_1 h_2 \ldots h_M]^T$$

is the filter coefficient vector for filters of order M. The autocorrelation $r_{YY}(k)=E[y(n)y(n-k)]$ is estimated at time n from the last N samples by $$r_{YY}(k; n) = \frac{1}{N-k} \sum_{i=0}^{N-k-1} y(n-i)y(n-i-k). \quad (5)$$

But the main problem here is that the autocorrelation matrix $R_{YY}$ can have arbitrarily bad conditions or can even become singular. This results in jumps of the filter coefficient every time Equation (4) is reevaluated for a new autocorrelation vector $r_{YY}(k)$ even when the changes are small. Coefficient jumps of this kind are unacceptable because the autocorrelation vector $r_{YY}(k)$ and h is determined for every sample. To overcome this problem, Equation (4) can be stabilized by making use of the fact that the autocorrelation matrix $R_{YY}$ is semi-definite.

$$(R_{YY} + \epsilon I)h = -r_{YY}, \epsilon > 0. \quad (6)$$

When a large window N is used for calculating the autocorrelation, the coefficient jumps are also reduced because this restricts the difference between consecutive values of the autocorrelation vector $r_{YY}(k,n)$. However, this slows down the adaption of new signal characteristics and accordingly is a less desirable solution.

Another possibility for preventing coefficient jumps is to replace the exact solution of the prediction problem by an iterative approximation using the steepest descent approach:

$$h(n+1) = h(n) - \mu(R_{YY} + \epsilon I)h(n) + r_{YY}) \quad (7)$$

wherein one iteration is carried out per sample. The maximum change of the filter coefficient between two successive samples can be controlled by the step-size parameter $\mu$. A stabilization of the autocorrelation matrix $R_{YY}$ is preserved to ensure that no substantial changes occur between the filters in the compressor and in the expander even when there is channel noise. However, a smaller stabilization parameter $\epsilon$ can be selected for an otherwise identical setting.

The stochastic gradient approach will be described in more detail in the following. Both of the approaches described above are very intensive computationally. Unfortunately, algorithms such as LMS (Least Mean Square), for example, are not suited to this purpose because they cannot guarantee minimum phase filters and therefore unstable filters can sometimes be obtained in the expander.

Figure 3:
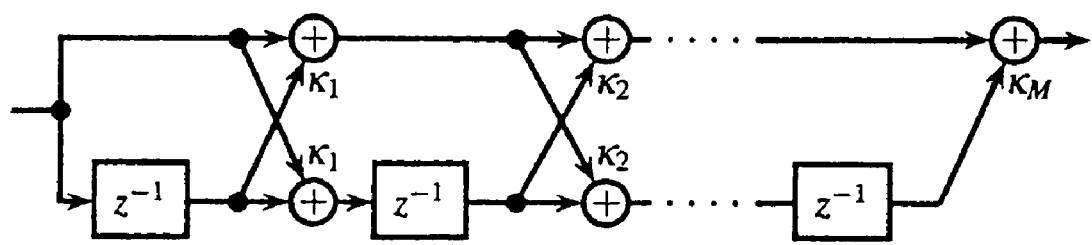
FIG. 3 shows a block diagram of a filter according to a second embodiment example.

However, unstable filters in the expander can be eliminated by using a lattice filter according to FIG. 3. The considerable advantage of a lattice filter consists in the minimum phase when the reflection coefficient satisfies $|\kappa_i| \leq 1$, which can easily be implemented.

The gradient adaptive lattice GAL algorithm in L. Griffiths, "A continuously-adaptive filter implemented as a lattice structure", *IEEE International Conference on Acoustics, Speech, and Signal Processing*, pages 683-686, May 1997, offers a simple and efficient stochastic gradient algorithm based on a lattice filter. While it quickly achieves a near-optimum solution, the algorithm does not converge and, instead, the solution causes small random movements around the optimum. This poses a problem for sinusoidal signals, where even a slight divergence between the zero point of the compressor filter and the corresponding pole of the expander filter results in an audible change in the signal level. This can display to a certain degree by using $|\kappa_i| \leq 1 - \epsilon$ in place of $|\kappa_i| \leq 1$ for suitable values of $\epsilon > 0$. However, robustness is not as great with the two methods based on autocorrelation.

The broadband compression which is used in connection with the adaptive filtering can be split into two parts, namely, detection of the envelope (or its level) and derivation of the gain factor therefrom.

The detector used in this case is based on the HighCom system by Telefunken which was described in J. Peissig, J. R. ter Haseborg, F. Keiler, and U. Zölzer, "Digital emulation of analog companding algorithms for FM radio transmission, *DAFX*-04 *Conference on Digital Audio Effects*, pages 285-290, Naples, Italy, 2004. Detection is carried out by integrating (i.e., low-pass filtering) the absolute value of the signal using three different time constants. The shortest time constant is used for the attack case when the absolute value of the current sample exceeds the envelope. A very long time constant which maintains the envelope almost constant is used for the release case initially. After a certain delay, a shorter release time is used when no attack has occurred.

Figure 4:
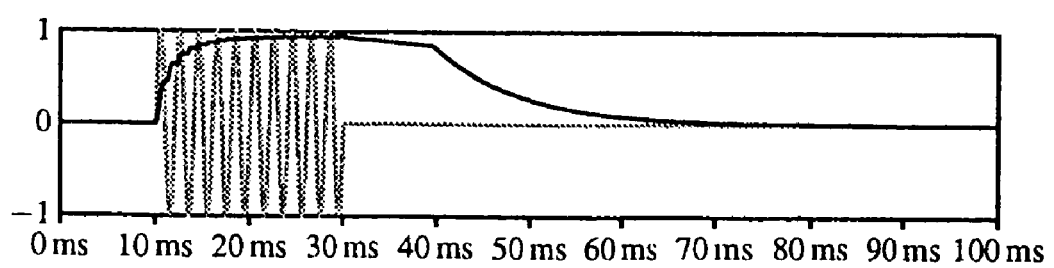
FIG. 4 shows a sine impulse.
Figure 5:
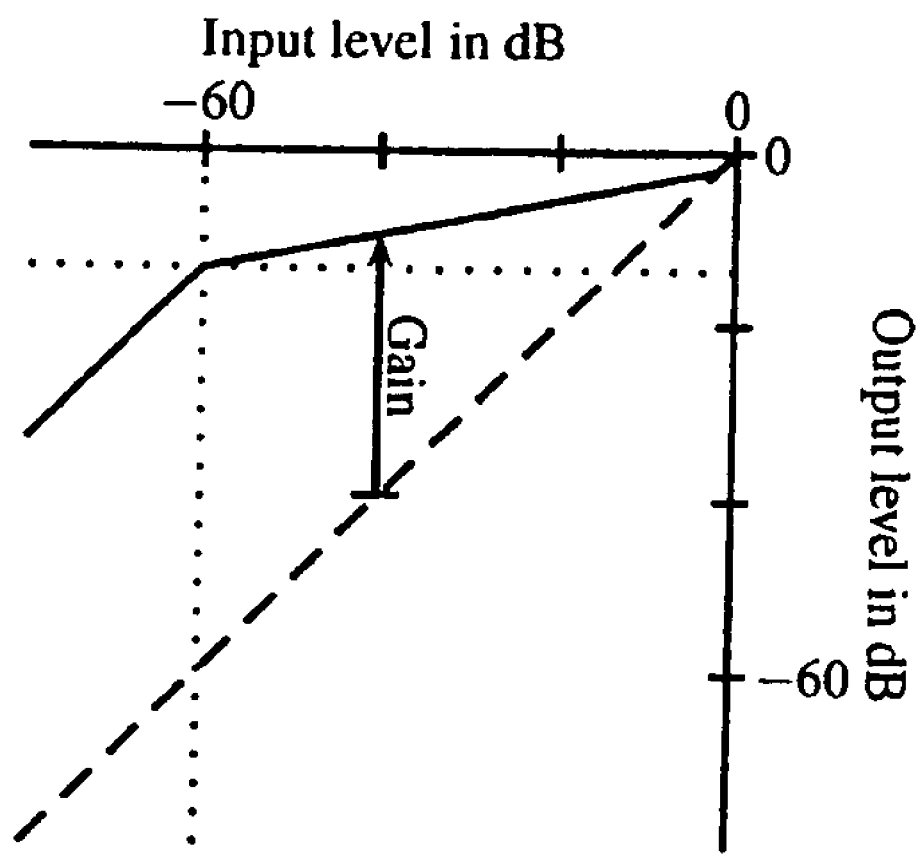
FIG. 5 illustrates a compression.
Figure 6:
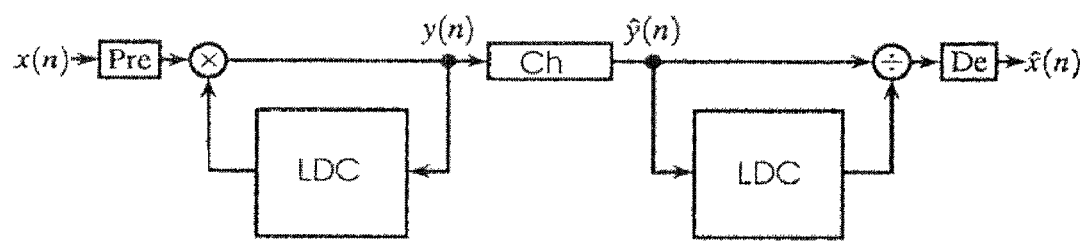
FIG. 6 shows a block diagram of a compander system according to the prior art.

FIG. 4 shows a sine impulse and the resulting envelope. The gain is calculated from this envelope using the compression law illustrated in FIG. 5 which shows the desired relationship between the input signal levels and the output signal levels. The gain to be used is then the difference between the output level and the input level and can be expressed in a simple manner as a function of the output level that is required for the feedback structures according to FIG. 1.

The adaptive pre-emphasis filtering attenuates peaks in the signal spectrum while amplifying the valleys, which results in an overall reduction in signal output. This necessitates a stronger or higher compression, i.e., a higher compression factor, than is normally needed in conventional compander systems. A compression factor of 2, for example, does not yield a gain factor g that satisfies Equation (3).

Analog transmission channels, particularly a radio channel, typically have additional noise. Compared to an actual FM radio link, additional Gaussian white noise presents an adequate model, although the actual noise is not true white noise. The effects of the white additional noise on the autocorrelation of a signal only show an increase of r(0) by the noise power $\sigma_N^2$, while all other values remain unchanged: However, this has an effect similar to the stabilization according to Equations (6) and (7) so that the influence of channel noise on the expander filter is negligible for the methods based on autocorrelation when $\sigma_N^2 \ll \epsilon$ or when the conditions of $R_{YY}$ are good and $\sigma_N^2 \ll r_{YY}(0) + \epsilon$. For sinusoidal signals and for strong channel noise, the expander filter is flatter than the compressor filter, which results in an attenuation of the sine components through the overall system.

The analysis is more complicated for a GAL-based approach because the stabilization used has no direct correspondence to the autocorrelation of the signal or spectrum. Sinusoidal signals are the critical signals because they suffer from time-variable amplitude changes for small values of c due to the randomness of the stochastic gradient process.

The only effect on the broadband compressor due to the time averaging carried out during envelope detection is based on the increase in signal power by $\sigma_N^2$ which can cause an insufficient attenuation in the expander as long as $\sigma_N^2 \ll r_{YY}(0) = \sigma_N^2$. Due to the compression that is carried out: $\sigma_N^2 \ll r_{YY}(0)$. The total amplification caused by this slightly compensates for the attenuation brought about by the autocorrelation methods.

Additional noise is not the only influence on the analog channel. It is also necessary to consider the analog filters, e.g., for suppressing a DC offset, with a nonlinear phase. These phase shifts have considerable influence on the broadband compander when the time averaging of the envelope detection is insufficient. If the envelope follows the signal too closely, the resulting modulation of the signal generates a harmonic and intermodular distortion. Without channel dispersion, the difference in the envelopes used for compression and expansion is small enough to allow for a demodulation and reconstruction of the original signal. After a nonlinear phase filtering, the expander tends to introduce additional distortion instead of eliminating it when the envelope is not sufficiently smooth.

Owing to the characteristics of the stochastic gradient process, the GAL algorithm is very susceptible to disturbances vis-à-vis channel dispersion. The autocorrelation depends only on the power spectrum, not on the phase. Therefore, methods based on autocorrelation are more robust provided the length N of the window used to approximate the autocorrelation according to Equation (5) is long enough so that edge phenomena may be disregarded.

The following discussion relates to some findings of a simulation by the compander system according to the present invention. This simulation was carried out in two steps: First, the robustness of a range of parameter sets was determined using sinusoidal input signals. The settings that proved to be the most robust, i.e., those which caused neither harmonic nor intermodular distortions or changes in amplitude greater than conventional companders, were subjected to pseudo-acoustic measurements.

For this purpose, the Objective Difference Grade ODG was determined according to "ITU Radiocommunication Bureau (BR), Recommendation ITU-R BS. 1387-1—method for objective measurements of perceived audio quality". Six different real-world signals were sampled at a rate of $f_s$=44.1 kHz, and the channel simulation operation was carried out at 50 dB and 30 dB signal-to-noise ratio SNR. The signal-to-noise ratio SNR was measured in relation to sinusoidal amplitude to maximum amplitude. The all-pass in the channel was not used so that the difference between the input signal and output signal of the total system could be calculated.

sors. The settings shown in Table 1 require approximately 110 additional multiplications and additions per sample for the adaptive filtering compared to the conventional broadband compander.

The compander system described above can be used, for example, in an audio transmission system. This enables a compression of an audio input signal by the compressor before the audio signal is transmitted over a channel, e.g., a radio link. The transmitted audio signal can be expanded in the expander.

While the foregoing description and drawings represent the present invention, it will be obvious to those skilled in the art that various changes may be made therein without departing from the true spirit and scope of the present invention.

What is claimed is:

1. A compressor device for a compander system, comprising:
    a pre-emphasis device for carrying out an adaptive pre-emphasis filtering of an input signal;
    an adding unit for adding the output of the pre-emphasis device to the input signal;
    a level detecting/control device for detecting a level of an output signal of the compressor device;
    a multiplying unit for multiplying an output of the adding unit with an output of the level detecting/control device, where the output of the multiplying unit corresponds to the output of the compressor device; and
    a filter adaption unit which receives the output signal of the compressor device as an input signal and performs an adaption of the pre-emphasis device by updating a filter coefficient according to a linear prediction based on an estimated autocorrelation of each output sample.

TABLE 1

| Signal | Multiband compander SNR: 50 dB better ▶ | Adaptive pre-/deemphasis SNR: 50 dB better ▶ | Multiband compander SNR: 50 dB better ▶ | Adaptive-pre/deemphasis SNR: 30 dB better ▶ |
|---|---|---|---|---|
| Acoustic guitar | ▬▬▬ —-1.3 | ▬▬▬ —-1.0 | ▬▬ —-2.0 | ▬▬▬ —-1.5 |
| E-bass | ▬▬ —-2.0 | ▬▬▬ —-1.5 | ▬ —-3.3 | ▬▬ —-2.5 |
| Male singing | ▬▬ —-2.2 | ▬▬▬ —-1.2 | ▬ —-3.1 | ▬▬ —-2.0 |
| Fem singing | ▬▬▬ —-1.1 | ▬▬▬ —-1.0 | ▬▬▬ —-1.4 | ▬▬▬ —-1.1 |
| Male voice | ▬▬▬ —-1.9 | ▬▬▬ —-1.2 | ▬▬ —-2.6 | ▬▬▬ —-1.4 |
| Fem. voice | ▬▬ —-2.0 | ▬▬▬ —-1.3 | ▬▬ —-2.8 | ▬▬▬ —-1.8 |

Table 1 shows the results of the above-described simulation for a multiband compander with an adaptive pre-emphasis/de-emphasis compander. The settings for the multiband compander were optimized to a signal-to-noise ratio SNR of 50 dB by means of listening tests. For the adaptive pre-emphasis/de-emphasis compander according to the present invention, the steepest descent approach (described above) was used for a filter of order M=8, for an autocorrelation window length of N=128, and for a stabilization parameter $\epsilon$=0.001. As can be seen from Table 1, the adaptive pre-emphasis/de-emphasis compander according to the present invention has a substantially improved perceived audio quality.

Accordingly, the compander system according to the present invention relies first on a dynamic compression and also on a linear prediction of a pre-emphasis unit in a compressor and a de-emphasis unit in an expander. The pre-emphasis unit and the de-emphasis unit each have feedback. Novel compander systems of this type are suitable not only for noise reduction but also for shaping spectral noise. In particular, a filter of order M=8 is sufficient to enable real-time applications to currently available digital signal processors.

2. The compressor device according to claim 1; wherein the pre-emphasis device has filters with unlimited impulse response behavior.

3. An audio signal transmitting device comprising: a compressor device according to claim 1.

4. An expander device for a compander system, comprising:
    a level detecting/control device for detecting a level of an input signal;
    a divider for dividing the output of the level detecting/control device from the input signal;
    a de-emphasis device for carrying out an adaptive de-emphasis filtering of an output signal of the expander device;
    an adding unit which is adapted to subtract the output signal of the de-emphasis device from the output signal of the divider, where the output signal of the adding unit constitutes the output of the expander device; and
    a filter adaption unit which receives the input signal of the expander device as input signal and which is adapted to carry out an adaption of the de-emphasis filtering by updating a filter coefficient according to a linear prediction based on an estimated autocorrelation of each output sample.

5. The expander device according to claim 4;
wherein the de-emphasis device has filters with unlimited impulse response behavior.

6. An audio signal reception device comprising:
an expander device according to claim 5.

7. An audio signal reception device comprising:
an expander device according to claim 4.

8. A compander system comprising:
at least one of:
a compressor device according to claim 1; and
an expander device according to claim 4.

9. An audio signal transmission system comprising:
a compander system according to claim 8.

10. A method for transmitting audio signals comprising the following steps:
carrying out a pre-emphasis filtering of an input signal ($x(n)$);
adding the input signal ($x(n)$) and a first output signal of the pre-emphasis filtering;
multiplying a second output signal of the addition by a first signal ($g(n)$), wherein the first signal ($g(n)$) represents a result of a level detection of a third output signal ($y(n)$) of the multiplication; and
wherein an adaption of the pre-emphasis filtering is carried out with the third output signal as input signal by updating a filter coefficient according to a linear prediction based on an estimated autocorrelation of each output sample.

11. The method for transmitting audio signals according to claim 10, further comprising:
receiving a transmitted signal; and
dividing the received input signal by a first output signal of a level detection of the received input signal;
wherein a second output signal of a de-emphasis filtering of a third output signal is subtracted from a fourth output signal of the division; and
wherein an adaption of the de-emphasis filtering is carried out with the received input signal as input signal.

* * * * *